United States Patent [19]
Tubbs

[11] Patent Number: 5,369,772
[45] Date of Patent: Nov. 29, 1994

[54] METHOD OF MAXIMIZING DATA PIN USAGE UTILIZING POST-BUFFER FEEDBACK

[75] Inventor: Michael E. Tubbs, Montgomery, Tex.

[73] Assignee: Compaq Computer Corporation, Houston, Tex.

[21] Appl. No.: 886,766

[22] Filed: May 21, 1992

[51] Int. Cl.$^5$ ............................................. G06F 9/00
[52] U.S. Cl. ..................................... 395/775; 395/275
[58] Field of Search .................. 395/775, 325, 275; 364/200; 307/465, 468

[56] References Cited

U.S. PATENT DOCUMENTS

| | | | |
|---|---|---|---|
| 4,195,352 | 3/1980 | Tu et al. | 307/468 |
| 4,803,622 | 2/1989 | Bain, Jr..et al. | 395/275 |
| 4,876,640 | 10/1989 | Shankar et al. | 364/200 |
| 4,894,563 | 1/1990 | Gudger | 307/468 |
| 4,896,296 | 1/1990 | Turner et al. | 307/465 |
| 4,992,680 | 2/1991 | Benedetti et al. | 307/465 |
| 5,015,884 | 5/1991 | Agrawal et al. | 364/716 |
| 5,023,485 | 6/1991 | Sweeney | 307/465 |
| 5,027,011 | 6/1991 | Steele | 307/465 |
| 5,043,879 | 8/1991 | Concha et al. | 395/775 |
| 5,079,451 | 1/1992 | Gudger et al. | 307/465 |
| 5,117,498 | 5/1992 | Miller et al. | 395/775 |
| 5,128,871 | 7/1992 | Schmitz | 364/490 |

OTHER PUBLICATIONS

PAL Device Date Book (1988) Advanced Micro Designs, Inc., pp. i and 5-214.

*Pal Device Data Book*, Advanced Micro Devices, Inc., pp. i, 5-17, 5-22, 5-26, 5-46, 5-103, 5-109, 5-113, 5-188, 5-122, 5-137, 5-184, 5-186 (1988).

*Primary Examiner*—Allen R. MacDonald
*Assistant Examiner*—Tarriq Hafiz
*Attorney, Agent, or Firm*—Pravel, Hewitt, Kimball & Krieger

[57] ABSTRACT

An improved programmable logic device programmed to maximize pin usage, and a method of using such a programmable logic device. The programmable logic device is programmed to use a data pin as an input pin by disabling the output buffer driving that pin. Then, when it is desired to drive the data pin as an output pin, the output buffer is enabled, and the pin is driven by a signal generated by the combinatorial logic on the programmable logic device.

4 Claims, 3 Drawing Sheets

METHOD OF MAXIMIZING DATA PIN USAGE UTILIZING POST-BUFFER FEEDBACK

BACKGROUND OF THE INVENTION

1. Field of the Invention

This invention generally relates to an apparatus in which data pin usage is maximized and a method for maximizing data pin usage. In particular, this invention relates to a programmable logic device programmed to use a data pin bidirectionally.

2. Description of Related Art

In the field of electronics, considerations concerning miniaturization, chip count, and cost constantly drive designers to better utilize existing devices. A recent innovation has been the development of programmable logic devices, which allow a designer to condense a relatively large amount of loose logical circuitry into a single integrated device. These devices have given designers the opportunity to lower chip counts, and thus reduce board space and cost, by replacing groups of discrete logical devices with a single chip. Programmable logic devices, or PLDs, come in many varieties such as programmed array logic (PALs), programmed logic arrays (PLAs), and read only memories (ROMs).

But these devices only present an opportunity to reduce board space, component count, and cost. To best realize these savings, designers must use these devices as efficiently as possible. Currently, these devices' data pins are only programmed for use unidirectionally. An output signal is output to one pin, while an input signal is input from another. At best, such use requires an excessive number of pins on the PLD. At worst, such use leads to the need for more devices than would otherwise be necessary.

As an illustration of this unidirectional use of PLD data pins, FIGS. 1 and 2 show how PLDs would generally be configured when a circuit requires data to be both received on and driven to a particular line. FIG. 1 illustrates, for example, how two PLDs of the prior art would be used. One PLD would input the data, as illustrated by PAL1, using the VALID(3:0) lines as inputs; another PLD would selectably drive the data lines, as illustrated by PAL2 selectably driving the VALID(3:0) lines through the use of PAL2 output enable line OE.

The circuit of FIG. 2 illustrates the wastefulness of this approach. In that circuit, PAL1 receives as inputs the VALID(3:0) lines, while PAL2 uses its data pins as outputs to drive the VALID(3:0) lines. Thus, two devices, or at least two pins, are required to input from and output to each VALID(3:0) line.

If a way to further maximize the usage of the data pins could be developed, it would have the potential of reducing chip count and the number of required pins, thus reducing cost and board space. Therefore, it would be desirable to maximize programmable data pin usage on PLDs to reduce chip count and the required number of pins, thus further reducing board size and cost.

SUMMARY OF THE INVENTION

Briefly, the invention is a PLD programmed to use one of its data pins to both transmit and receive data, and a method of using such a PLD so that one data pin can function as both an input and an output pin. A PLD with post-buffer feedback is programmed to use a data pin as an input pin. During an input cycle, the PLD's programmed combinatorial logic disables an output buffer driving the data pin, thus logically isolating the PLD's combinatorial logic's output line from that data pin. Then, during the output cycle, the combinatorial logic enables the output buffer, thus causing the PLD to drive the data pin as an output pin.

Further, the PLD can use an internal register to store an intermediate value for later use as an output to the data pin. For example, the input can be read from the data pin, used by the PLDs combinatorial logic, stored in the register, and later driven as an output onto the same data pin.

In this way, one pin is used by the PLD for both input and output of data. This reduces pin count and chip count, thus minimizing required board space and manufacturing cost.

Examples of the more important features of this invention have been summarized rather broadly so that the detailed description may be better understood. There are, of course, additional features of the invention that will become apparent in the detailed description and that will also form the subject matter of the claims that follow.

BRIEF DESCRIPTION OF THE FIGURES

In order that the features of this invention may be better understood, a detailed description of the invention, as illustrated in the attached drawings, follows.

DETAILED DESCRIPTION OF THE PREFERRED EMBODIMENT

Figure 3:
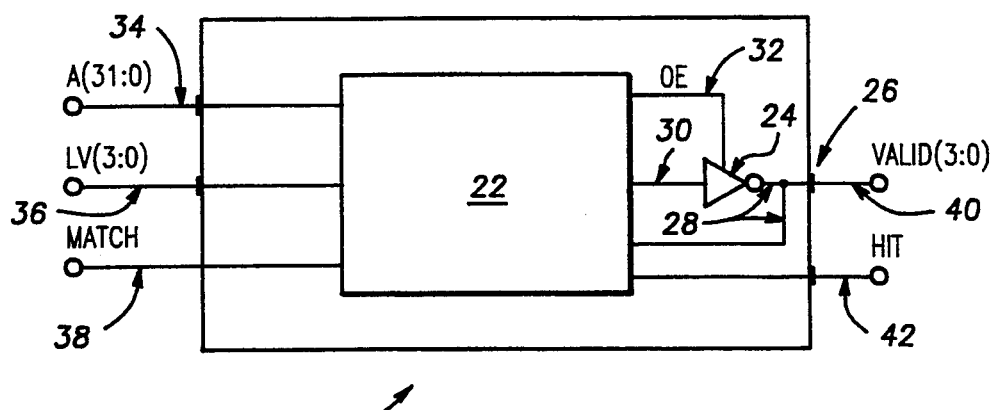
FIG. 3 is a functional drawing of how a PLD programmed according to this invention is configured to accomplish the functions according to this invention.

Turning now to the drawings, FIG. 3 shows a programmable logic device (PLD) 20. As in all PLDs, the PLD 20 contains internal combinatorial logic 22, with various signals being carried into and out of that combinatorial logic. In the PLD according to the invention, the PLD 20 also contains an output buffer 24. The output buffer 24 is preferably an inverting tri-state buffer which, when enabled, drives an input/output (I/O) pin 26 via internal I/O line 28. When disabled, the output buffer 24 is tri-stated, and thus does not drive a signal to the I/O pin 26.

The I/O pin 26 is typically a data pin of the PLD 20. Internally, the I/O line 28 electrically connects the I/O pin 26, the combinatorial logic 22, and the output of the output buffer 24. Also internal to the PLD 20 are an output line 30 and an output enable line OE 32. The combinatorial logic 22 drives the output line 30, which is connected to the input of the output buffer 24. The combinatorial logic 22 also drives the output enable line OE 32, which is connected to the enable input of the output buffer 24.

The PLD 20 will typically have a number of other inputs and outputs for various signals supplied by or needed by external circuitry. The combinatorial logic 22 can use the various inputs to generate various outputs in accordance with the logic required by the circuitry.

The I/O pin 26 is bidirectional. It is either driven by external circuitry, or it is driven by the output buffer 24 via the I/O line 28.

The PLD 20 can be any programmable logic device that supports post-buffer feedback and selectably enableable output buffers. A PLD supports post-buffer feedback if its combinatorial logic has an input that is electrically connected to a particular data pin, and that same data pin is also electrically connected to the output of an output buffer. An output buffer is selectably enableable if it can be tri-stated or otherwise disabled by an output of the PLD's combinatorial logic. Refering to FIG. 3, when the output buffer 24 is enabled, it drives the I/O line 28 which then drives the I/O pin 26 and provides an input signal to the combinatorial logic 22. When the output buffer 24 is disabled, however, the combinatorial logic 22 is still electrically connected to the I/O pin 26 via the I/O line 28. Thus, when the output buffer 24 is disabled, the combinatorial logic receives as an input whatever is externally driven onto the I/O pin 26. This is post-buffer feedback. Devices employing post-buffer feedback and selectably enableable output buffers include Advanced Micro Devices PAL16L8, PAL20L8, AmPAL16L8, PAL16P8A, PAL20S10, PAL20L10A, and PAL20L8. These devices are illustrative only and any programmable logic device with post-buffer feedback and selectably enableable output buffers could be programmed to operate according to the present invention.

In practice, the I/O pin 26 can be used bidirectionally, either driving a signal to external circuitry or receiving a signal driven from external circuitry. Responding to the states of external signals driven to the PLD 20 and thus to the combinatorial logic 22, the combinatorial logic 22 can select the direction of the I/O pin 26. If the combinatorial logic 22 drives the output enable line OE 32 low, the output of the output buffer 24 will tri-state and will thus no longer drive the I/O line 28 to the inverse of the output line 30. When the output buffer 24 is tri-stated, external circuitry can drive the I/O line 28, which the combinatorial logic 22 can then use as an input from the external circuitry. In such a state, the I/O pin 26 essentially becomes an input.

At other times, depending on the input signals to the PLD 20, the combinatorial logic 22 will drive the output enable line OE 32 high, enabling the output buffer 24. In this state, the output buffer 24 will drive the I/O line 28 to the inverse of the output line 30, which is also driven by the combinatorial logic 22, again based on the various input signals. In this configuration, the signal on the I/O line 28 is driven through the I/O pin 26 to external devices, and the I/O pin 26 essentially becomes an output pin.

The combinatorial logic 22 is programmed such that when the various signals indicate it should be receiving an input signal from the I/O pin 26, it disables the output buffer 24, and thus the I/O pin 26 acts as an input. Similarly, when the various signals indicate that the combinatorial logic 22 should be driving the I/O pin 26 as an output, the combinatorial logic 22 enables the output buffer 24, and the I/O pin 26 becomes an output pin driven to the inverse of OUTPUT 30. Thus, one pin can be used for both input and output, depending on the states of the various signals.

Figure 4:
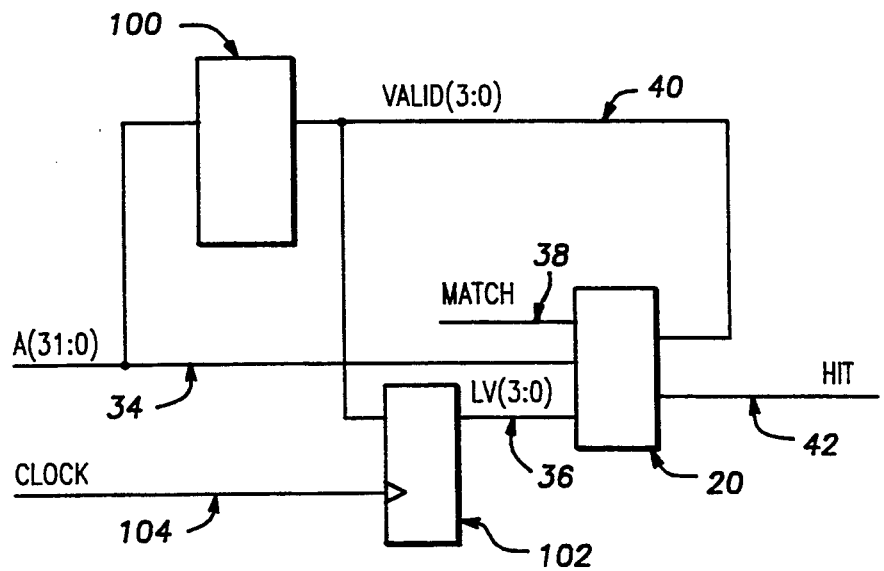
FIG. 4 is a block diagram of how the PLD of FIG. 3 is used in a circuit to accomplish the functions according to this invention.

As a typical use of this embodiment of the invention, FIG. 4 illustrates the PLD 20 used in a portion of a microprocessor cache memory system. Cache memory systems are well known in the field of microprocessor system design, and a portion of such a system involves determining whether a certain memory element, called a line, held in a high speed cache memory is "valid," that is, determining whether that cache line actually reflects the contents of the lower speed main memory. In this embodiment, a cache line is one 32-bit word. FIG. 4 illustrates such a circuit for determining whether a cache line is valid.

Typically, the PLD 20 is configured in circuitry with a valid RAM 100 and an external register 102. The valid RAM 100 would typically be a high speed SRAM, for example part number TC5588J12 from Toshiba, and the external register 102 would typically be a high speed latch, for example part number 74F374.

Inputs to the PLD 20 typically include address bus lines A(31:0) 34, latched valid bit lines LV(3:0) 36, and the tag match line MATCH 38. The PLD 20 typically only uses a portion of the address bus lines A(31:0) 34, here A(3:2). Outputs from the PLD 20 typically include the hit line HIT 42. Finally, valid bit lines VALID(3:0) 40 are connected to the PLD 20 as bidirectional data lines so that the PLD 20 selectably uses the valid bit lines VALID(3:0) 40 for input or for output. One of the valid bit lines VALID(3:0) 40 would connect to the I/O pin 26 of FIG. 3, and that I/O pin 26, the I/O line 28, the output buffer 24, and the output line OUTPUT 30 would typically be repeated for each of the valid bit lines VALID(3:0) 40, here four times. Although this embodiment uses four valid bit lines VALID(3:0) 40, this number is strictly dependent on the cache system in which the PLD 20 is used. There are a corresponding number of latched valid bit lines LV(3:0) 36, four in this embodiment, but again dependant on the cache system. Of course, other signals and control circuitry could be connected to the PLD 20 and used by the combinatorial logic 22.

The valid RAM 100 typically has as inputs portions of the address bus lines A(31:0) 34. In this embodiment, the valid RAM 100 uses A(16:4). The valid RAM 100 also connects to the valid bit lines VALID(3:0) 40 and uses those lines bidirectionally.

The external register 102 typically uses as an input the system clock line CLOCK 104. The external register 102 also uses the valid bit lines VALID(3:0) 40, but only as inputs. As outputs, the external register 102 drives the latched valid bit lines LV(3:0) 36.

Thus, the valid RAM 100 and PLD 20 are both driven by the address bus lines A(31:0) 34, and the valid RAM 100, the PLD 20, and the external register 102 are all interconnected by the valid bit lines VALID(3:0) 40.

The address bus lines A(31:0) 34 can be any arbitrary number of bits wide. When the circuit of this embodiment is used with the AMD29000 CPU for example, the address bus lines A(31:0) 34 are 32 bits wide [bits (31:0)] and can be driven from a number of sources, such as a microprocessor or a direct memory access controller. In the preferred embodiment, however, the circuitry only logically uses A(21:0), for a memory addressing capability of 1M of 32-bit words. The system clock line CLOCK 104 is typically connected to the system clock, which runs at an arbitrary rate such as 25 MHz in the preferred embodiment. The tag match line MATCH 38 is typically driven by external tag comparison circuitry and indicates when that circuitry has determined that the cache memory does contain the set of lines specified by A(16:4) on the address bus lines A(31:0) 34. A set consists of an arbitrary number of cache lines, and there is typically one valid bit line VALID(3:0) 40 for each line of one set in cache memory. These signals are well known in the construction of cache memory subsystems.

In practice, external circuitry, such as a microprocessor or memory controller, requests data from a memory address by driving the address bus lines A(21:0) 34. External tag comparison circuitry then compares A(21:17) of the address driven on the address bus lines A(31:0) 34 to internal tags using A(16:4) as an index to its internal tags. If the tag comparison circuitry finds a matching tag, then it drives MATCH 38 high; else, it drives MATCH 38 low.

While this tag comparison is occurring, the valid RAM 100 drives the valid bit lines VALID(3:0) 40 to values it has stored at a location indexed by A(16:4). These signals on the valid bit lines VALID(3:0) 40 correspond to individual lines stored in the cache memory. A high bit indicates that the corresponding line in the cache memory is current, and that the cache memory can provide that line to the circuitry requesting the data at the memory address driven onto the address bus lines A(21:0) 34. A low bit indicates that the line in the cache memory is not current, and the data must be supplied by the slower main memory. The external register 102 stores the values on the valid bit lines VALID(3:0) 40 in response to the appropriate clock transition on CLOCK 104 and then drives the latched valid bit lines LV(3:0) 36 to those stored values.

During this period of the tag and valid lookup, the PLD 20 has disabled its internal output buffers which selectably drive the valid bit lines VALID(3:0) 40. These buffers correspond to the output buffer 24 in FIG. 3. Thus, during this period of the cache cycle, the PLD 20 can use data pins corresponding to the I/O pin 26 to input the values of the valid bit lines VALID(3:0) 40. The PLD 20 then uses the signals on the address bus lines A(3:2) 34, the tag match line MATCH 38, and the valid bit lines VALID(3:0) 40. From these values, it generates in its combinatorial logic 22 the value to drive onto the hit line HIT 42.

During the second period of the cache cycle, the valid RAM 100 stops driving the valid bit lines VALID(3:0) 40, and, if a cache miss occurred and data will be retrieved from main memory rather than cache memory, the valid RAM 100 expects input values to be provided on the valid bit lines VALID(3:0) 40. The valid RAM 100 then uses the signals on the valid bit lines VALID(3:0) 40 to update the memory location from which it initially retrieved the stored valid bit values. The PLD 20 drives these valid bit lines by enabling its output buffers and driving the valid bit lines VALID(3:0) 40 with values it has generated in its combinatorial logic 22. These values are based on the values provided to the PLD 20 by the address bus A(3:2) 34, the tag match line MATCH 38, and the latched valid bit lines LV (3:0) 36. Typically, the PLD 20 is programmed to provide these signals using the following equations:

VALID[n]

= ((ADDR == ADDRn) # LV[n]) & MATCH ; BLOCK
; MATCH
(ADDR == ADDRn) & !MATCH ; BLOCK
; MISS

VALID.oe = (QSTATE == UPDATE);

In this programming, "==" denotes equality, "#" denotes logical-or, "&" denotes logical-and, and "!" denotes logical-not. Further, VALID[n] indicates the value to drive valid bit line n of the valid bit lines VALID(3:0) 40; LV[n] corresponds to the value of latched valid bit n of the latched valid bit lines LV(3:0) 36; VALID.oe corresponds to the value the PLD 20 will internally drive to the enable of its output buffers which drive the valid bit lines VALID(3:0) 40 (which corresponds to the output enable line OE 32 in FIG. 3); MATCH is the value of the tag match line MATCH 38; ADDR is a value corresponding to the signals on the address bus lines A(3:2) 34; ADDRn is a constant which denotes that the cache line specified by ADDR corresponds to valid bit VALID[n]; and QSTATE==UPDATE is generated by the internal combinatorial logic 22 and is true only when a write occurs to the valid RAM 100 on the valid bit lines VALID(3:0) 40.

Figure 1:
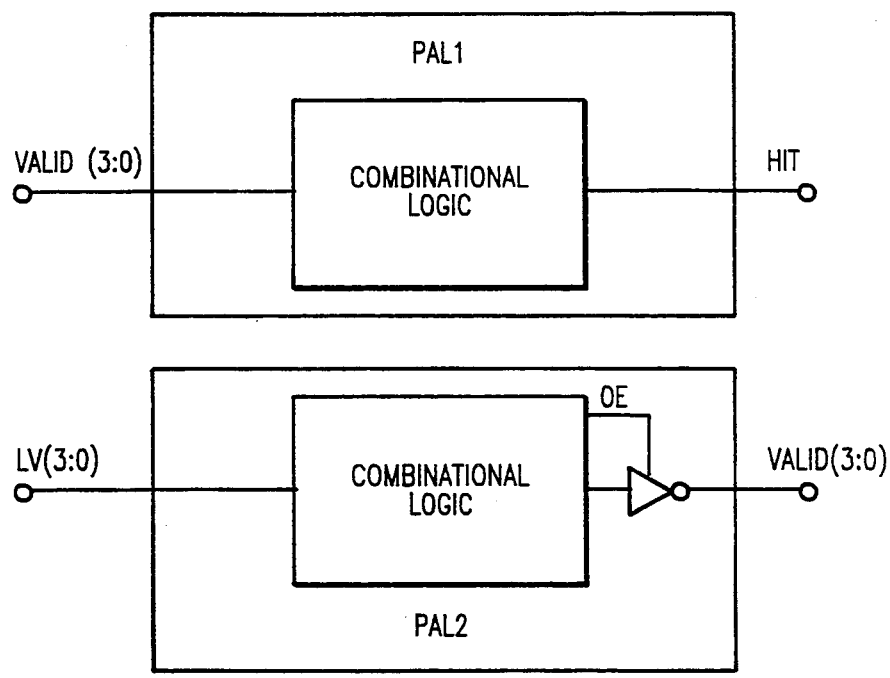
FIG. 1 is a functional drawing of how two PLDs would have been previously configured to accomplish the functions according to this invention.
Figure 2:
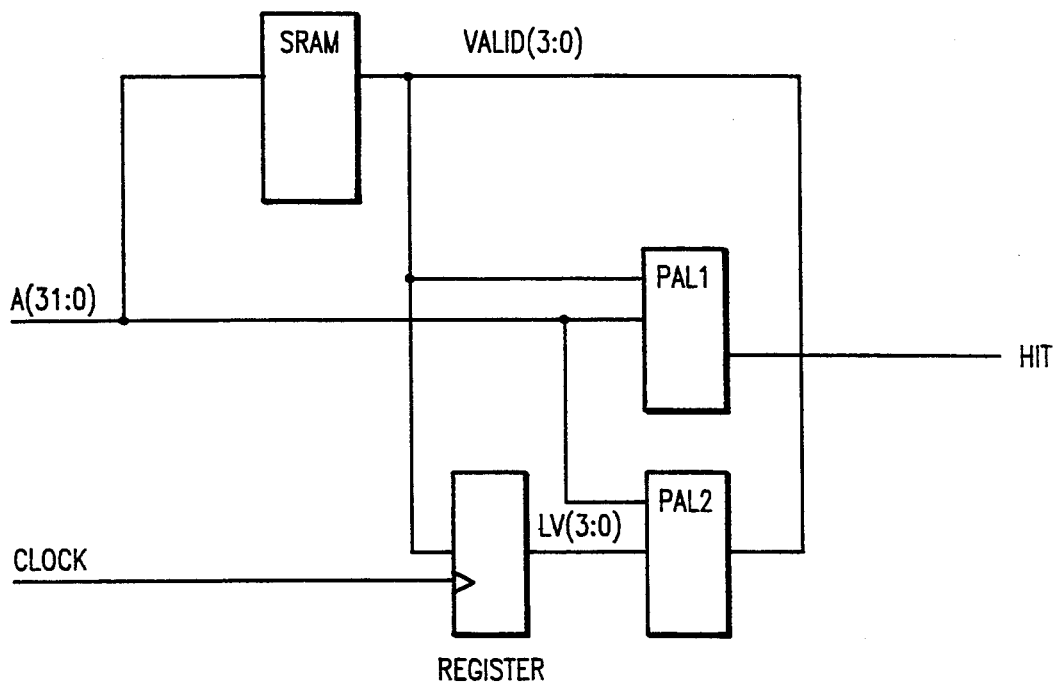
FIG. 2 is a block diagram of how the two PLDs of FIG. 1 would have been used in a circuit to accomplish the functions according to this invention.

Such a system would significantly reduce chip count over previous methods of using programmable logic devices. Rather than requiring one pin for input and one pin for output, or requiring two separate PLDs as in FIG. 2, this circuit uses one pin on the PLD 20 bidirectionally.

Figure 5:
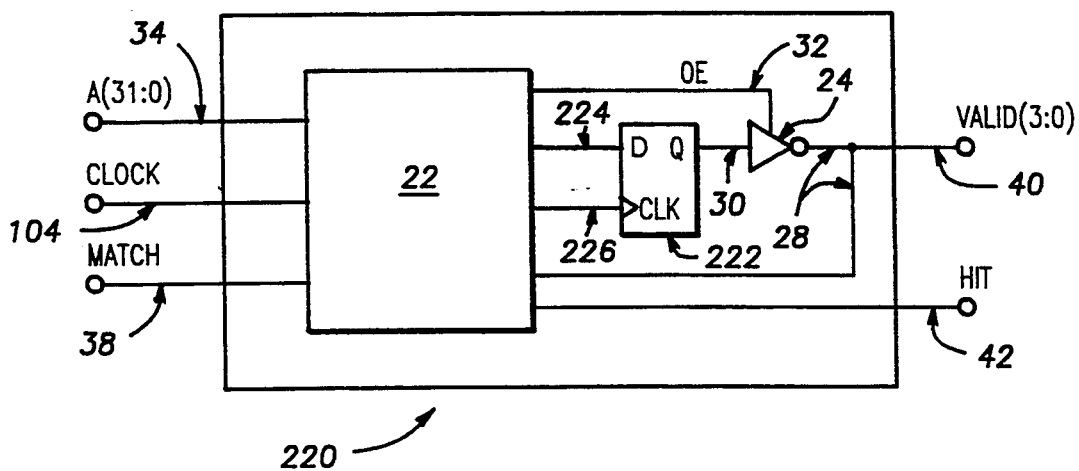
FIG. 5 is a functional drawing of an alternate embodiment of a PLD programmed according to this invention.

As an alternative embodiment, FIG. 5 illustrates a registered PLD 220 similar to the previous PLD 20. In addition to the elements of the PLD 20 shown in FIG. 3, the registered PLD 220 contains an internal register 222. The combinatorial logic 22 now drives the clock input on the internal register 222 via a latch line VCLK 226. The combinatorial logic 22 also drives a stored output line 224 to the data input of the internal register 222. The internal register 222 then drives the output line 30.

The registered PLD 220 is a slightly more complex device than the previously described PLD 20. As in the PLD 20, the registered PLD 220 must support both post-buffer feedback and selectably enableable output buffers, but the registered PLD 220 must also provide an internal storage register. Further, for purposes of this embodiment, the internal register 222 should be rising edge triggered and have a zero hold time. Examples of PLDs which satisfy these requirements include Advanced Micro Devices PAL22RX8A, PAL20RA10, and PAL16RA8. Again, these devices are merely illustrative and can be substituted with any programmable logic device that includes rising edge triggered zero hold time registered outputs, post-buffer feedback, and selectably enableable output buffers.

In practice, the internal register 222 takes over the functions of the external register 102 in FIG. 4. Thus, the registered PLD 220 stores the signal on the stored output line 224 for later use by the output buffer 24.

Figure 6:
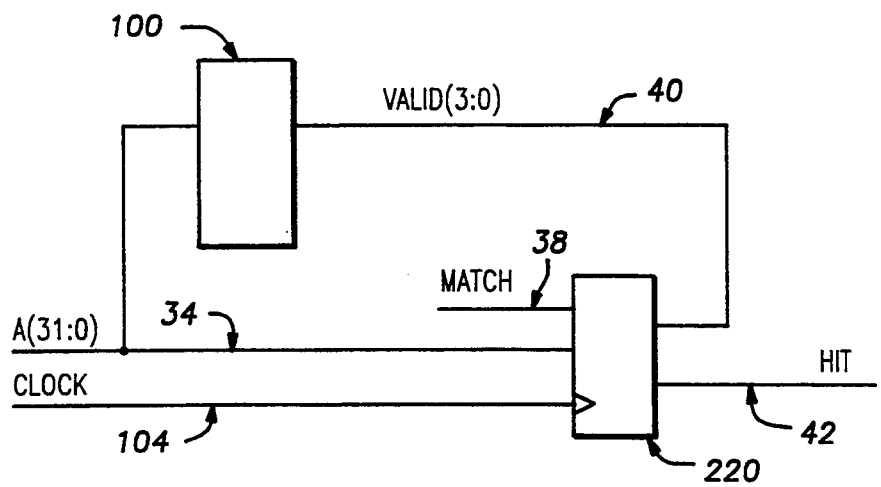
FIG. 6 is a block diagram of how the PLD of FIG. 5 is used in a circuit to accomplish the functions according to this invention.

The registered PLD 220 is typically used in the circuit of FIG. 6. This circuit is similar to the circuit of FIG. 4, but the external register 102 is no longer needed, as it is incorporated into the registered PLD 220. The internal register 222 is repeated for each valid bit line VALID(3:0) 40. In practice, the circuit of FIG.

6 functions similarly to the circuit of FIG. 4. A difference occurs, however, in the way the registered PLD 220 and the PLD 20 handle the valid bit inputs. As the PLD 20 uses the external register 102 to store the valid bit lines VALID(3:0) 40, the PLD 20 does not manipulate VALID(3:0) until after they have been stored in that register. In the registered PLD 220, however, VALID(3:0) are manipulated by the combinatorial logic 22 and then a result is stored in the internal register 222.

The registered PLD 220 would typically be programmed for operation in the circuit of FIG. 6 using equations such as:

VALID[n]

```
:= ((ADDR = = ADDRn) # VALID[n]) & MATCH  ; BLOCK
                                          ; MATCH
 # (ADDR = = ADDRn) & !MATCH              ; BLOCK
                                          ; MISS

VALID.oe = (QSTATE = = UPDATE);
VCLK     = (QSTATE = = HIT) & CLOCK
```

In this program, all the signals are as previously defined, but further, ":=" denotes the registered output provided by the internal register 222, CLOCK equals the value of the system clock line CLOCK 104, VCLK is the equivalent of the latch line VCLK 226, and QSTATE= =HIT corresponds to a predetermined "hit" state generated by the combinatorial logic 22 and indicates that an external device has requested data from memory and that the tag comparison circuitry and valid bit logic are currently determining if the requested cache line is in fact current.

Figure 7:
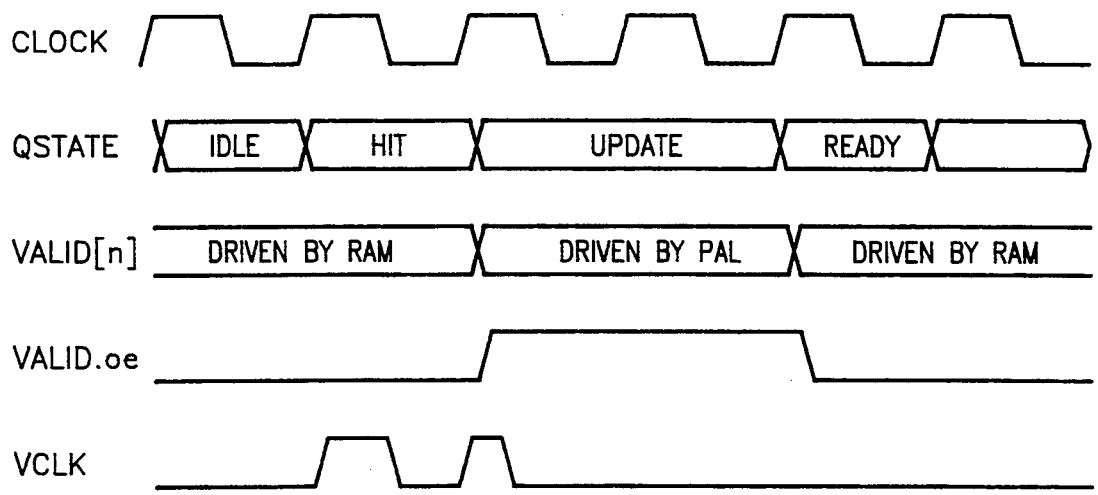
FIG. 7 is a timing diagram showing the various signals received and generated by the (PLD) of FIGS. 5 and 6 in operation according to this invention.

In use, these equations would generate the signals shown in FIG. 7. These signals show how VALID[n] and thus the corresponding valid bit lines VALID(3:0) 40 would be driven. As can be seen, VALID[n] is driven by the external RAM (which is the valid RAM 100) when VALID.oe is low. Then, VALID.oe goes high, enabling the output buffer (corresponding to the output buffer 24), and the registered PLD 220 then drives the corresponding valid bit lines VALID(3:0) 40.

The VCLK signal corresponds to the latch line VCLK 226, and causes the internal register 222 to latch on the rising edge with no required hold time. In the equations, the rising edge of VCLK causes VALID[n] to latch, which is done immediately before QSTATE= =UPDATE, that state corresponding to a write to the valid RAM 100.

This invention has been described in terms of particular embodiments. Obviously, modifications and alterations to these embodiments will be apparent to those skilled in the art in view of this disclosure. It is, therefore, intended that all such equivalents, modifications, and variations fall within the spirit and scope of the invention as claimed.

What is claimed is:

1. A method of maximizing the usage of a first data pin on a programmable logic device having a selectably enableable output buffer for driving the first data pin and post-buffer feedback for inputting a signal from the first data pin when a signal is provided to the first data pin by external circuitry, comprising:
   selectively disabling the output buffer during a first period whereby it does not drive the first data pin;
   inputting an input value to combinatorial logic in the programmable logic device from the first data pin, said input value driven onto the first data pin by the external circuitry during said first period;
   driving an output value to the input of the output buffer;
   selectively enabling the output buffer during a second period whereby the output buffer drives said output value onto the first data pin;
   generating an intermediate value in the combinatorial logic and driving said intermediate value as said output value to said input of the output buffer;
   storing said input value in a register external to the programmable logic device;
   driving a second data pin on the programmable logic device with said stored input value; and
   using said stored input value received over said second data pin in said combinatorial logic to generate said intermediate value.

2. A method of maximizing the usage of a first data pin on a programmable logic device having a selectably enableable output buffer for driving the first data pin and post-buffer feedback for inputting a signal from the first data pin when a signal is provided to the first data pin by external circuitry, comprising:
   selectively disabling the output buffer during a first period whereby it does not drive the first data pin;
   inputting an input value to combinatorial logic in the programmable logic device from the first data pin, said input value driven onto the first data pin by the external circuitry during said first period;
   driving an output value to the input of the output buffer;
   selectively enabling the output buffer during a second period whereby the output buffer drives said output value onto the first data pin;
   generating an intermediate value based on said input value in the combinatorial logic;
   storing said intermediate value in the programmable logic device; and
   driving said stored intermediate value as said output value to said input of the output buffer.

3. Programmed logic for connection to external circuitry that maximizes its usage of a data pin, comprising:
   a programmable logic device having a selectably enableable output buffer for driving a data pin and post-buffer feedback for inputting a signal from said data pin, said programmable logic device programmed to:
   selectively disable said output buffer during a first period whereby it does not drive said data pin;
   input an input value to combinatorial logic on said programmable logic device from said data pin, said input value driven onto said data pin by the external circuitry during said first period;
   drive an output value to the input of said output buffer;
   selectively enable said output buffer during a second period whereby said output buffer drives said data pin respondably to said output value;
   generate an intermediate value based on said input value in said combinatorial logic;
   store said intermediate value in said programmable logic device; and
   drive said stored intermediate value as said output value to said input of said output buffer.

4. A circuit for maximizing the usage of a data pin on programmable logic for connection to external circuitry comprising:

a programmable logic device having a selectably enableable output buffer for driving a first data pin, post-buffer feedback for inputting a signal from said first data pin, and a second data pin, said programmable logic device programmed to:

selectively disable said output buffer during a first period whereby it does not drive said first data pin;

input an input value to combinatorial logic on said programmable logic device from said first data pin, said input value driven onto said first data pin by the external circuitry during said first period;

generate an intermediate value in said combinatorial logic from a stored input value driven onto a second data pin;

drive said intermediate value as an output value to said input of said output buffer; and selectively enable said output buffer during a second period whereby said output buffer drives said first data pin respondably to said output value; and means external to said programmable logic device for storing said input value and for driving said stored input value to said second data pin of said programmable logic device.

* * * * *